United States Patent [19]
Ning et al.

[11] Patent Number: 5,723,370
[45] Date of Patent: Mar. 3, 1998

[54] FET AND/OR BIPOLAR DEVICES FORMED IN THIN VERTICAL SILICON ON INSULATOR (SOI) STRUCTURES

[75] Inventors: Tak Hung Ning; Ben Song Wu, both of Yorktown Heights, N.Y.

[73] Assignee: International Business Machines Corporation, Armonk, N.Y.

[21] Appl. No.: 713,061

[22] Filed: Sep. 12, 1996

Related U.S. Application Data

[62] Division of Ser. No. 368,069, Jan. 13, 1995, Pat. No. 5,581,101.
[51] Int. Cl.$^6$ .................................................. H01L 21/84
[52] U.S. Cl. ............................................ 438/156; 438/268
[58] Field of Search ......................................... 438/156, 268

[56] References Cited

U.S. PATENT DOCUMENTS

| | | | |
|---|---|---|---|
| 4,753,896 | 6/1988 | Matloubian | 257/350 |
| 4,982,266 | 1/1991 | Chatterjee | 257/350 |
| 5,312,782 | 5/1994 | Miyazawa | 438/156 |
| 5,545,586 | 8/1996 | Koh | 438/270 |

FOREIGN PATENT DOCUMENTS 2-246259  10/1990  Japan ...................................... 257/350

*Primary Examiner*—John Niebling
*Assistant Examiner*—Brendan Mee
*Attorney, Agent, or Firm*—Whitham, Curtis Whitham & McGinn; Stephen C. Kaufman

[57] ABSTRACT

A process for fabricating Ultra Large Scale Integrated (ULSI) circuits in Silicon On Insulator (SOI) technology in which the device structures, which can be bipolar, FET, or a combination, are formed in vertical silicon sidewalls having insulation under and in back thereof so as to create SKI device structures. The silicon sidewall device SOI structures, when fabricated, take the form of cells with each cell having a plurality of either bipolar devices, FET devices, or a combination of these devices, such as collectors, emitters, bases, sources, drains, and gates interconnected within the planes of the regions of the devices in the cells and can be interconnected within the planes of the regions of devices in adjacent cells. Further, the interconnections to adjacent cells can be made from the back of the silicon sidewalls.

10 Claims, 17 Drawing Sheets

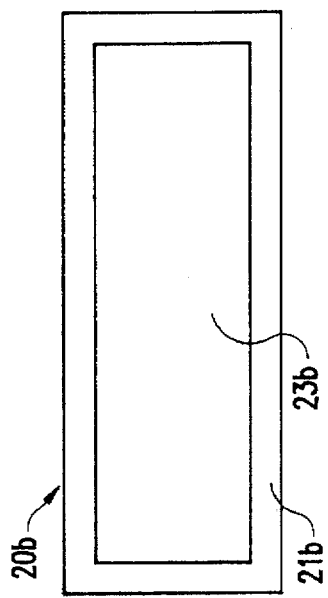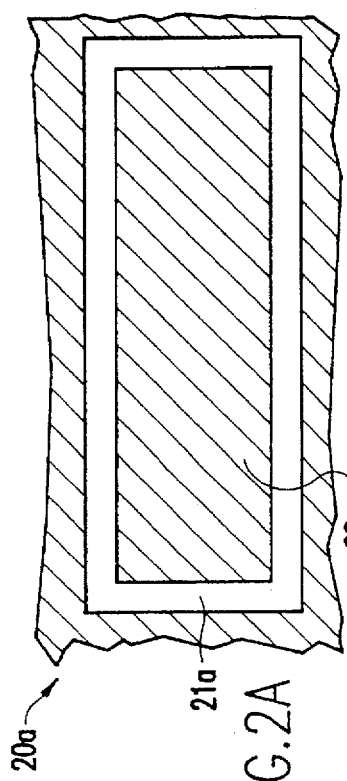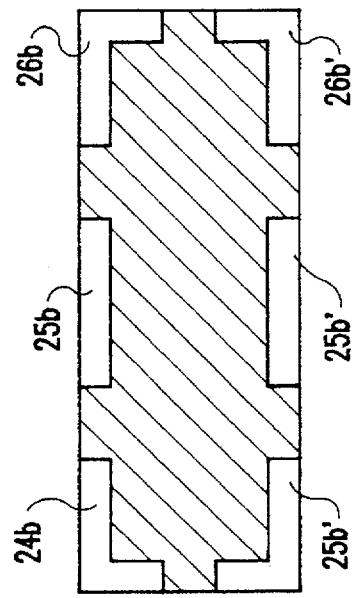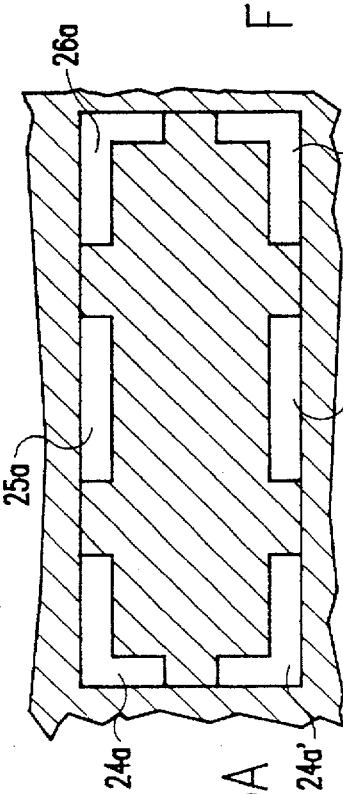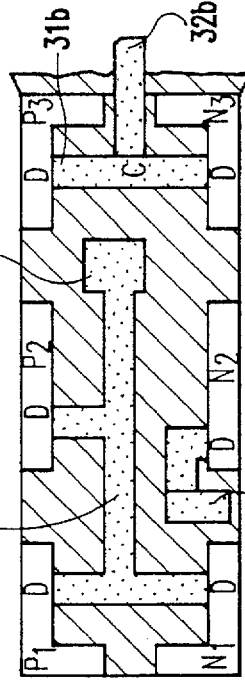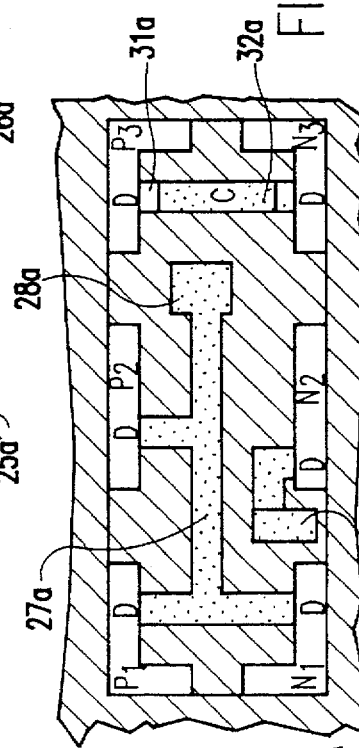

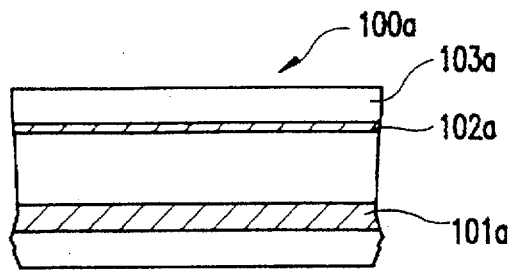
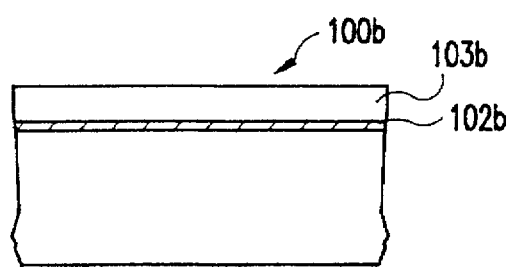
FIG.8A  FIG.8B
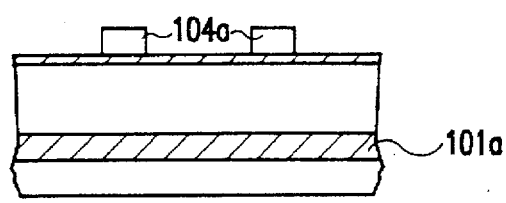
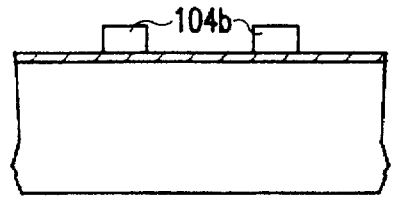
FIG.9A  FIG.9B
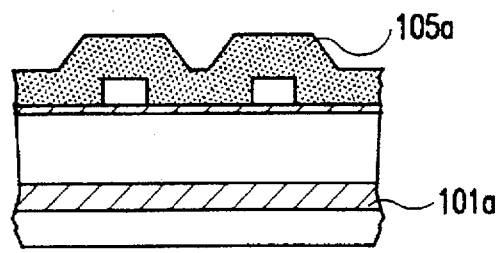
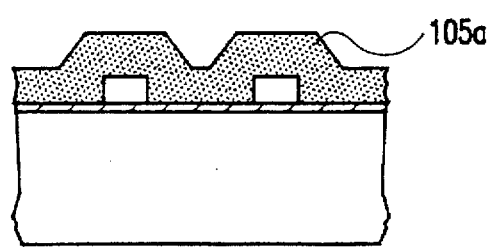
FIG.10A  FIG.10B
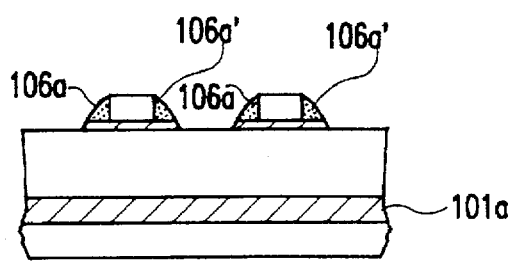
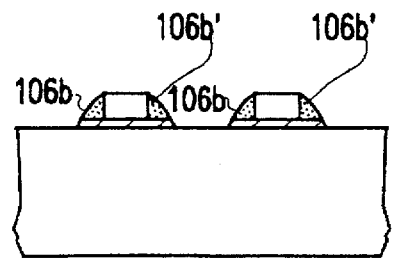
FIG.11A  FIG.11B

FET AND/OR BIPOLAR DEVICES FORMED IN THIN VERTICAL SILICON ON INSULATOR (SOI) STRUCTURES

CROSS REFERENCE TO RELATED APPLICATION

This application is a divisional of application Ser. No. 08/368,069 filed Jan. 3, 1995, now U.S. Pat. No. 5,581,101.

BACKGROUND OF THE INVENTION

Of key concern in developing Ultra Large Scale Integrated (ULSI) circuits is achieving high performance with increased density within the limits of optical lithography. In this regard, FET and Bipolar devices fabricated on Silicon on Insulator (SOI) have demonstrated significant performance (speed and power) improvement over devices fabricated on silicon substrates and, also, are less sensitive to radiation. This is because silicon devices have problems with inherent parasitic circuit elements due to junction capacitances. One way to avoid this problem is to fabricate silicon devices on an insulating substrate. Hence, the reason for the Silicon on Insulator (SOI) technology is that it offers the highest performance for a given feature size due to minimizing parasitic capacitance. However, such SOI substrates are more costly than silicon substrates because it must be prepared with a buried insulating layer. By some methods of preparation, the buried insulating layer is not defect free. In addition, conventional manufacturing techniques must be modified for fabricating devices using SOI substrates which adds further cost.

In addition, high density devices are difficult to obtain in a planar structure due to limitation of optical lithography resolution. To increase the density of the integrated circuits, the transistors can be formed vertically thereby reducing the active lateral surface area required for the device. Therefore, vertical transistors, such as MOSFETs, have significantly higher packing density of, at least, a factor of 10 over their standard lateral counterparts. However, state of the art vertical MOSFETs have had a very limited application due to the silicon substrate used to fabricate them. When a silicon substrate is used, it acts as a common source or drain for all transistors and, because of this, only one type of vertical MOS transistor has been fabricated on a silicon wafer until recently. By using a silicon on insulator (SOI) wafer, complementary MOS (CMOS) devices have been fabricated in adjacent islands with a common gate formed in a trench between the adjacent complementary MOS devices. However, in this process, the starting point is a SOI wafer in which the source or drain are formed in the silicon above the insulating layer followed by an epitaxical deposition of a silicon layer. Such a process prevents interconnecting the buried source and drain between the islands.

Bipolar integrated circuits, of course, provide higher speed operation and greater drive currents than the FET circuits. Further, the integration of FET and bipolar transistors on a single substrate has become highly desirable. However, SOI substrates predominately have been used in fabricating FETs, such as CMOS, because bipolar or biFET processes on SOI substrates have resulted in defect density problems caused by the buried insulating layer not being as defect free.

SUMMARY OF THE INVENTION

It is an object of the present invention to provide a novel process for fabricating vertical FETs, biFETs, and bipolar devices of all types in Silicon on Insulator (SOI) technology.

Another object of the present invention is to provide a novel process having the ability of merging vertical complementary FETs and bipolars in SOI technology A further object of the present invention is to provide a novel process implementing SOI technology without requiring expensive SOI substrates.

An additional object of the present invention is to provide a novel vertical device structure in which the majority of the interconnections are in the same plane or level as the regions of the devices being interconnected thereby allowing greater flexibility in wiring the devices and minimizing the wiring length.

According to one aspect of the present invention, the transistor structures are fabricated in thin vertical SOI walls whose silicon thickness is defined by a sidewall image and whose insulation portion is formed by insulation filled shallow trenches adjacent the outer silicon sidewall. Thus, the advantages of SOI are achieved with a conventional silicon substrate. The bottom of the silicon sidewalls are isolated from the silicon substrate by thermally grown oxide extending to the insulation filled trenches or by a P/N junction. According to another aspect of the present invention, functional circuits can be designed to be fabricated within a SOI cell with the regions, such as the source, drain and gate or the emitter, collector and base of the devices of the circuit being essentially interconnected within the silicon and in many cases in the same plane so that the wiring distance in the cell is minimized and the overall dimensions of functional circuit is minimized.

Other objects, features and advantages of the present invention will become more apparent from the following description taken in conjunction with the accompanying drawings.

BRIEF DESCRIPTION OF THE DRAWINGS

FIG. 2a is a plan view of a cell of the present invention showing bottom oxide insulation and a continuous silicon sidewall.

FIG. 2b is a plan view of a cell of the present invention showing a silicon bottom and a continuous silicon sidewall.

FIGS. 3a and 3b are a plan view of a cell of the present invention showing the continuous silicon sidewall of FIGS. 2a and 2b divided into six device sections and with bottom oxide insulation.

FIG. 4a is a plan view of the first level or plane of the SOI cell of FIG. 3a showing the drains of CMOS transistors of the circuit of FIG. 1 and their interconnections within the cell.

FIG. 4b is a plan view of the first level or plane of the SOI cell of FIG. 3b showing the drains of CMOS transistors of the circuit of FIG. 1 and their interconnections within the cell and "c" connection outside the cell surrounded by vertical insulation.

FIGS. 8a, 9a, 10a, 11a, 12a, 13a, and 14a are cross sectional views showing a process for fabricating SOI cells of the present invention starting with a SOI substrate.

FIGS. 8b, 9b, 10b, 11b, 12b, 13b and 14b are cross sectional views showing a process for fabricating SOI cells of the present invention starting with a silicon substrate.

FIGS. 14, 15, 16, 17, 18, 19 and 20 are cross sectional views showing an alternative process of fabricating a plurality of SOI cells in accordance with the present invention.

DESCRIPTION OF THE PREFERRED EMBODIMENTS

Figure 1:
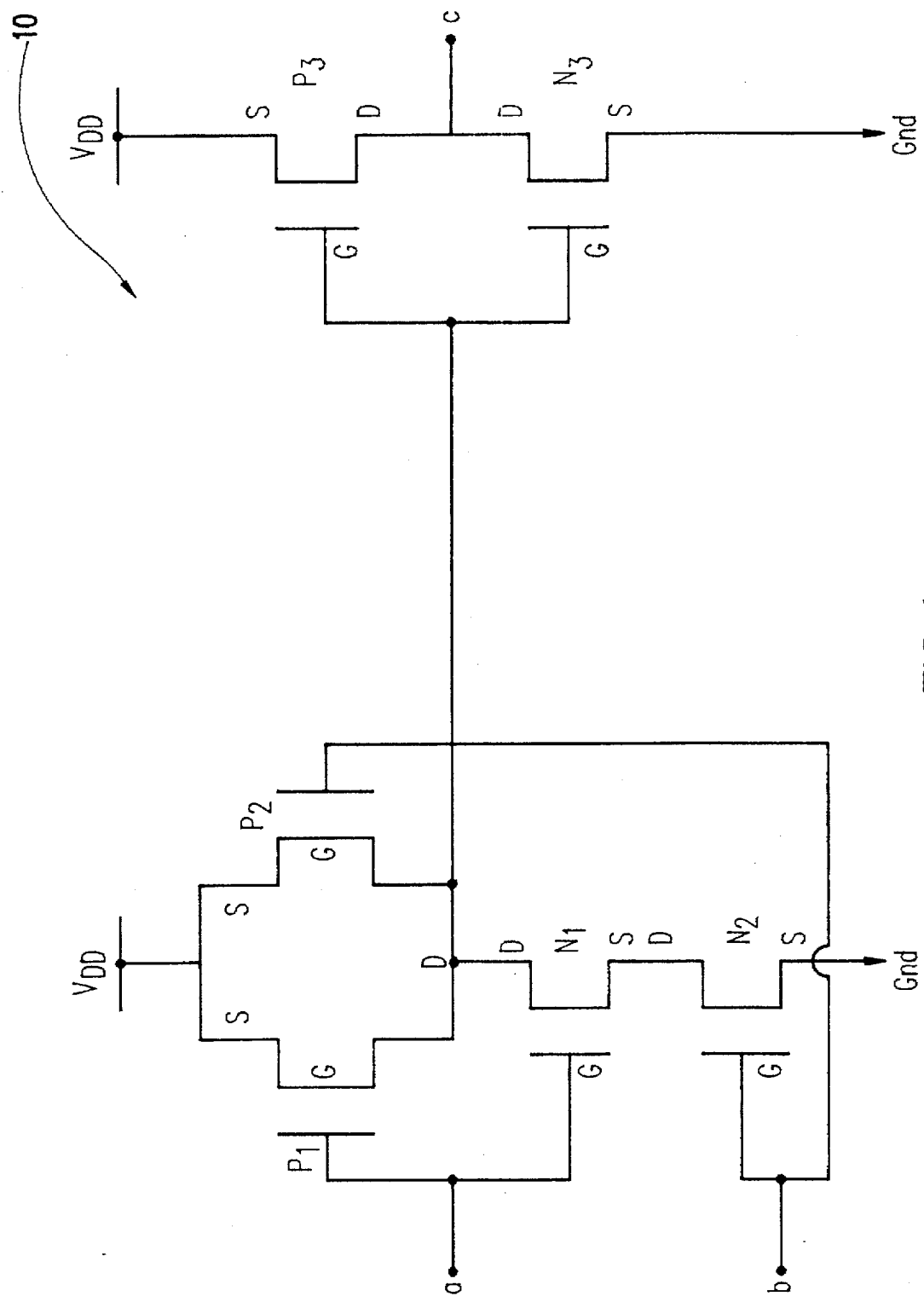
FIG. 1 is a schematic view of an AND circuit which can be fabricated by the process of the present invention to form a novel vertical SOI device.
Figure 5B:
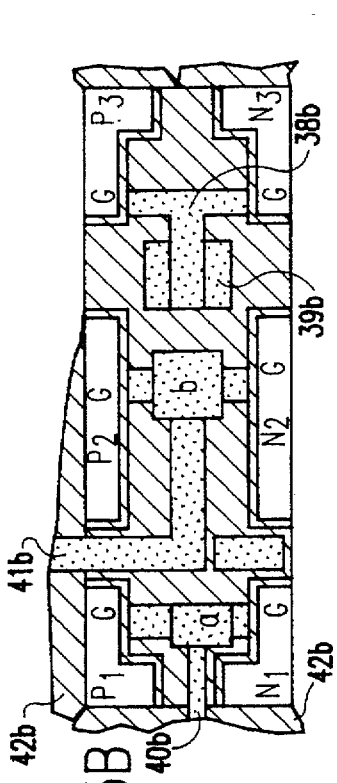
FIG. 5b is a plan view of the second level or plane of the SOI cell of FIG. 3 showing the gates of CMOS transistors of the circuit of FIG. 1 and their interconnections within the cell and "a" and "b" connections outside the cell surrounded by vertical insulation.
Figure 6B:
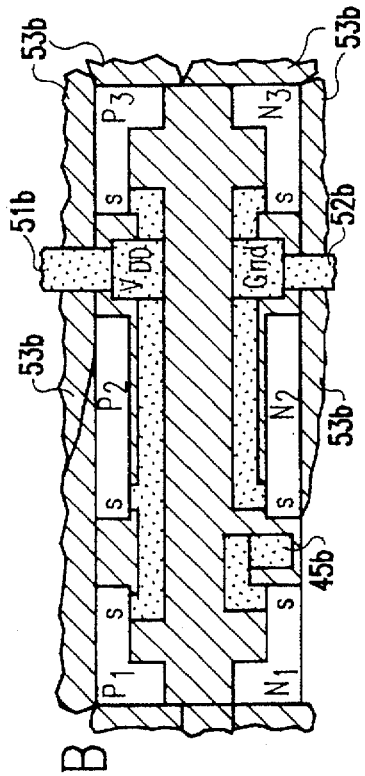
FIG. 6b is a plan view of the third level or plane of the SOI cell of FIG. 3 showing the CMOS transistors of the circuit of FIG. 1 and their interconnections within the cell and "$V_{DD}$" and "Gnd" out of the cell surrounded by vertical insulation.
Figure 7B:
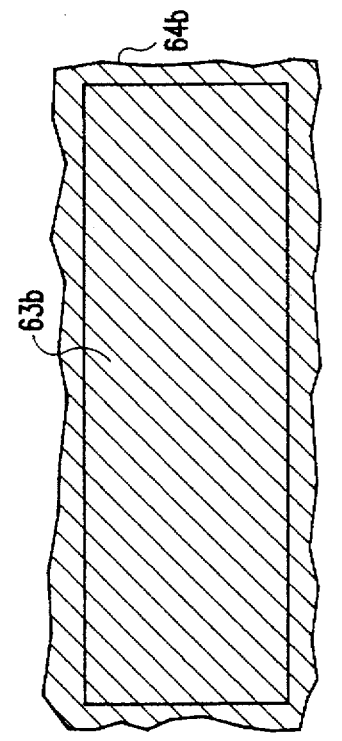
FIG. 7b is a plan view of the upper level or plane of the SOI cell of FIG. 3 showing a top oxide insulation layer and vertical insulation around the cell
Figure 5A:
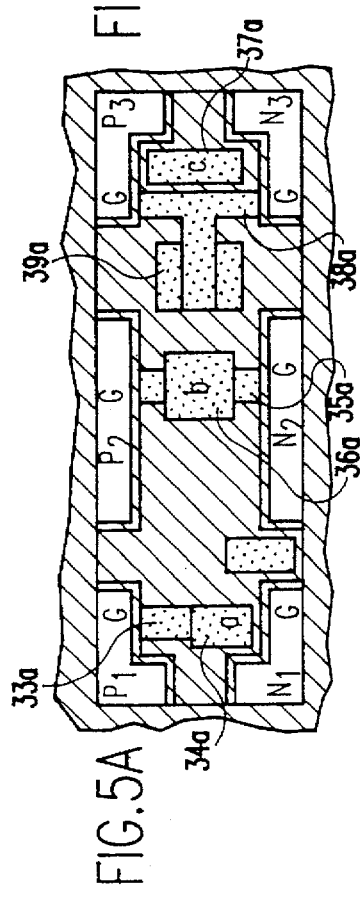
FIG. 5a is a plan view of the second level or plane of the SOI cell of FIG. 3 showing the gates of CMOS transistors of the circuit of FIG. 1 and their interconnections within the cell.
Figure 6A:
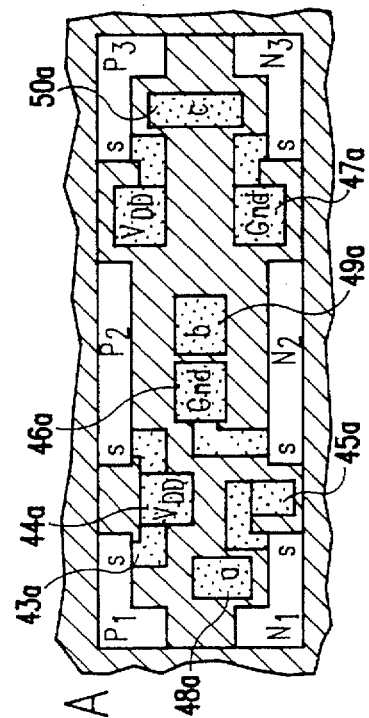
FIG. 6a is a plan view of the third level or plane of the SOI cell of FIG. 3 showing the sources of CMOS transistors of the circuit of FIG. 1 and their interconnections within the cell.
Figure 7A:
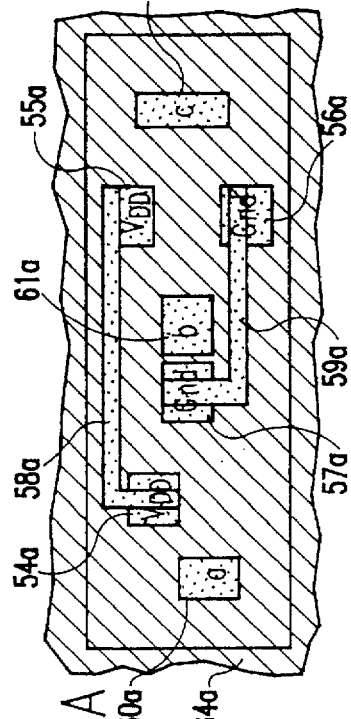
FIG. 7a is a plan view of the upper metallization level or plane of the SOI cell of FIG. 3 showing the contacts for interconnection to the devices of other SOI cells (not shown) and vertical insulation around the cell.
Figure 12A:
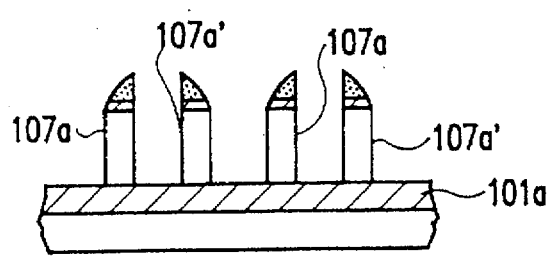
Figure 12B:
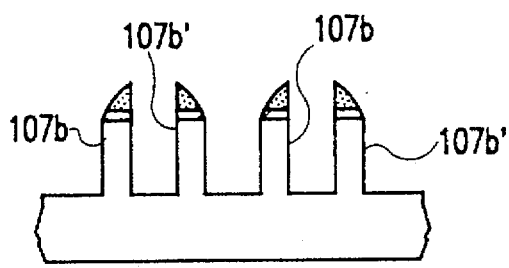
Figure 13A:
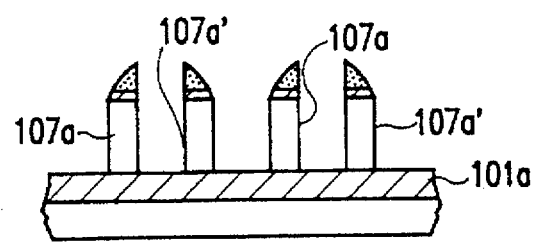

In FIG. 1, a conventional AND circuit 10 is schematically shown with inputs "a" and "b" and output "c" for solving the equation (a×b=c). This circuit contains six transistors, three of which, $P_1$, $P_2$, and $P_3$ are complementary to the other three transistors $N_1$, $N_2$, $N_3$. This circuit 10 can be fabricated as three CMOS devices in an SOI cell of the present invention to yield a novel device structure as shown in FIGS. 2 through 7 with either the majority (FIGS. 2a through 7a) or all (FIGS. 2b through 7b) of the interconnections between the transistors being within the silicon body. In FIG. 2a, an SOI cell 20a of the present invention is shown with a continuous silicon sidewall 21a and a bottom layer 22a of silicon oxide because the starting wafer is a conventional SOI wafer. Preferably, as shown in FIG. 2b, the continuous silicon sidewall 21b is formed on a convention silicon wafer and the insulating bottom oxide layer 22b is thermally grown between and under the silicon sidewall as shown in FIG. 3b. Since only the bottom of the silicon sidewall 21b must be isolated from the silicon substrate 23b (FIG. 2b), a P/N junction (not shown) can be formed at the bottom of the sidewall to provide the electrical isolation from the silicon substrate. Regardless of the type of the starting wafer, the single crystalline silicon sidewall of the SOI cell of the present invention is divided into device sections 24a, 24a', 25a, 25a' 26a and 26a' (FIG. 3a) and 24b, 24b', 25b, 25b', 26b, and 26b' (FIG. 3b) in which the transistor devices necessary to fabricate the circuit of FIG. 1 will be formed. In FIG. 4a, the drains (D) of the six transistors $P_1$, $P_2$, $P_3$, $N_1$, $N_2$, and $N_3$ are formed in sections 24a, 25a, 26a, 24a', 25a' and 26a' and the drains of $P_1$, $N_1$, and $P_2$ are interconnected as shown by numeral 27a at the same level or in the same plane along with a contact pad 28a for a via connection. The drain of $N_2$ is formed with a via connection 29a. In the same plane or on the same level, the drains of $P_3$ and $N_3$ are interconnected as shown by numeral 31a along with a via connection 32a, which will provide the "c" output at the upper metallization level. Preferably, the "c" output is formed with an external connection 32b at this level ,as shown in FIG. 4b, for linking to a device of another SOI cell (not shown). At the next plane or level, which is the gate (G) level of the six transistors as shown in FIGS. 5a and 5b, the gates of $P_1$ and $N_1$ are interconnected as shown by the numeral 33a and formed with a connecting via 34a which will provide the input "a" at the upper metallization level. To provide the input "b", the gates of $P_2$ and $N_2$ are interconnected as shown by numeral 35a at this plane or level and formed with a connecting via 36a. Since the output "c" emanates from the drains of $P_3$ and $N_3$, a connecting via 37a is formed in this plane or level and vertically interconnects with via 32a FIG. 4a. The gates of $P_3$ and $N_3$ are interconnected as shown by numeral 38a (FIG. 5a) and 38b (FIGS. 5b) and formed with a connecting pad 39a and 39b (FIGS. 5a and 5b) to connect with the via 28a and 28b (FIGS. 4a and 4b) of the drain level. Preferably, as shown in FIG. 5b, inputs "a" and "b" are formed with external connections 40b and 41b, respectively, at this level for linking to device(s) of other SOI cell(s) (not shown). With this preferred embodiment, the "c" output connecting via pad of FIG. 5a is not required and the external connections are surrounded by vertical oxide insulation. At the source (S) level of FIG. 6a, the sources of $P_1$ and $P_2$ are interconnected as shown by numeral 43a with a connecting via 44a for $V_{DD}$. Also, the source of $P_3$ is formed with a connecting via for $V_{DD}$. The source of $N^1$ is connected to a via 45a (FIG. 6) to permit connection through the via 45a (FIG. 5) of the gate level to the drain of $N_2$. For Linking to Gnd, the sources of $N_2$ and $N_3$ are each formed with a connecting vias 46a and 47a, respectively. Also, connecting vias 48a, 49a and 50a are formed in this level for linking inputs "a" and "b" from the gate level and output "c" from the drain level, respectively. Preferably, $V_{DD}$ and Gnd can be formed with external connections 51b and 52b at this level as shown in FIG. 6b. They are surrounded by vertical oxide insulation 53b and, with this alternative embodiment, the contact vias for "a", "b" and "c" of FIG. 6a are not required. At the metallization level of FIG. 7a, two $V_{DD}$s pads 54a, 55a and two Gnd pads 56a, 57a are interconnected as shown by numeral 58a and 59a and contact pads 60a, 61a, and 62a are formed for inputs "a" and "b" and output "c", respectively. Because the interconnections and pads of FIG. 7a are made at lower levels in the alternative embodiment of FIGS. 4b through 6b, the upper level 63b of FIG. 7b is only an oxide insulating layer or passivating layer. Thus, the functional AND circuit of FIG. 1 is formed within the SOI cell and the layout of the circuit was designed so that the majority of the interconnections of the cell in FIGS. 4a through 7a are within the silicon body and in the same levels or planes of the parts of the transistors, thereby minimizing the dimension of the cell for this AND circuit. Further, in the preferred embodiment of FIGS. 4b through 7b, the interconnections of the cell are totally within the silicon body are further reduced in wiring length by forming external connections to other SOI cells at the appropriate levels of the vertical transistors. Although not shown in FIGS. 2b through 7b, connection to the various regions of the transistors can be made from the back of the vertical transistor to devices of other cells. If no external connections are required from the back of the silicon sidewalls of the SOI cell, the back of the cell is vertically surrounded by an insulating material 64a, 64b, such as oxide, as shown in FIGS. 7a and 7b.

One process for fabricating SOI cells of the present invention is shown in FIGS. 8 through 13 and it is preferred when greater flexibility is required for wiring between SOI cells. The starting silicon wafer can either be a conventional SOI wafer 100a with a buried oxide insulator layer 101a as shown in FIG. 8a or, preferably, is a conventional silicon wafer 100b without the buried oxide insulator layer as shown in FIG. 8b. If it is desired to use chem/mech polishing for planarization, a polish stop (not shown) of an oxide/ nitride pad is patterned on the surface of the silicon wafer. To minimize damage to the silicon sidewalls when chem/ mech polishing is used for planarization, which would lower the yield of the chips on the wafer, the spacing of the silicon sidewalls should be relatively close with this process. As shown in FIGS. 8a and 8b, an oxide layer 102a, 102b is formed on the silicon surface followed by a polysilicon layer 103a, 103b, which is patterned to define the inner dimensions of the cells as shown in FIGS. 9a and 9b. The patterned polysilicon 104a and 104b also functions as the mandrel for the silicon sidewalls to be formed and the thickness of the polysilicon layer determines the width of silicon sidewalls and the size of the vertical transistor to be formed therein. As shown in FIGS. 10a and 10b, the patterned polysilicon 104a and 104b is coated with a conformal layer 105a and 105b of silicon nitride and is anisotropically etched, such as by reactive ion etching, to form sidewall barriers 106a, 106a' 106b, and 106b", as shown in FIGS. 11a and 11b for etching, such as by reactive ion etching, the polysilicon mandrel 104a and 104b, the oxide layer 102a, 102b and the silicon body not under the silicon nitride barrier. The resulting vertical silicon structures 107a, 107a', 107b, and 107b' are shown in FIGS. 12a and 12b with each pair constituting a cell as shown in plan view in FIGS. 2a and 2b which can be sectioned into a plurality of individual transistors. If the starting wafer is the conventional SOI wafer 100a of FIG. 8a, an insulating layer 101a will be under the silicon sidewall cells as shown in FIG. 13a. Preferably, the conventional silicon wafer of FIG. 8b, is used and an insulating layer 101b, as shown in FIG. 13b, of silicon oxide is formed after the silicon sidewall is protected by a thin silicon nitride layer 108b. Herein, the silicon in the bottom 109b of the open trench along with the bottom portion of the silicon sidewalls is thermally oxided to silicon oxide so as to create a complete insulating bottom layer and form a SOI cell. However, in accordance with the present invention, only isolation of the bottom of the sidewall from the silicon substrate by insulation, such as silicon oxide, is required. The complete bottom of the open trench does not have to be formed with insulation. The advantage of silicon sidewall cell process of FIGS. 8 through 13 is that the back walls of the silicon sidewalls are open and interconnection of device regions, such as sources, drains, and gates of FETs, and emitters, collectors, and bases of bipolar can be made between cells (pairs of silicon sidewalls) at the level of the particular device regions. This allows greater flexibility in wiring the devices of integrated circuit and minimizes the wiring length.

It will be recognized by those skilled in the art that other approaches to forming the silicon sidewalls are possible by using different mandrels. For example, in an alternative embodiment, insulating trenches are formed and the upper level of the trenches are used as the mandrels for a conformal coating which forms the barrier for the silicon sidewalls. This alternative process is described in the following more detailed description in conjunction with FIGS. 14 through 34 and includes the formation of CMOS devices in the SOI cells.

Figure 14A:
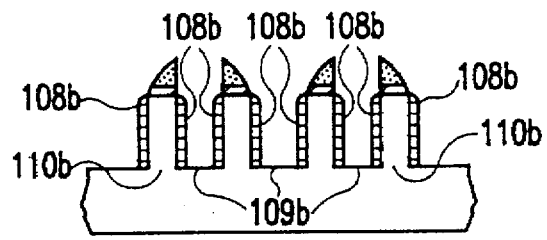
Figure 13B:
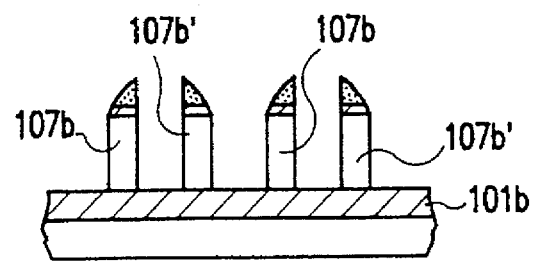
Figure 14B:
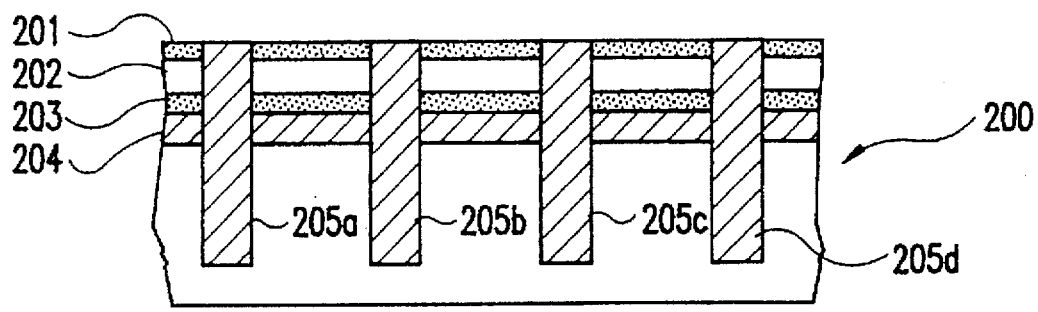
Figure 15:
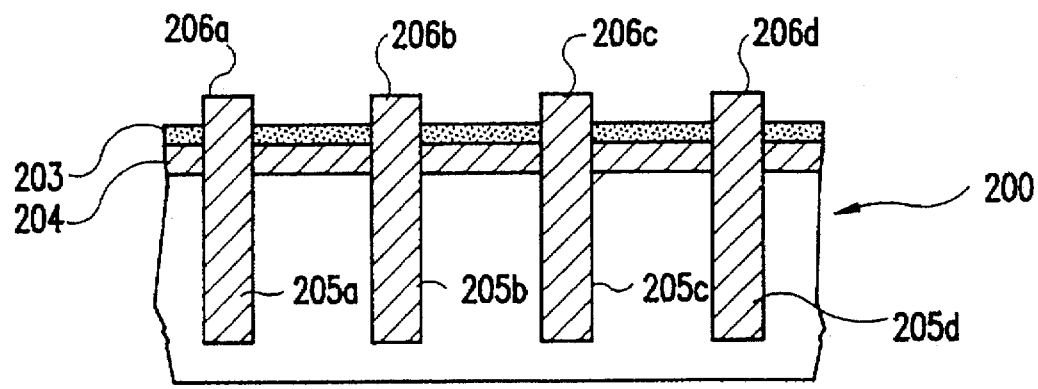
Figure 16:
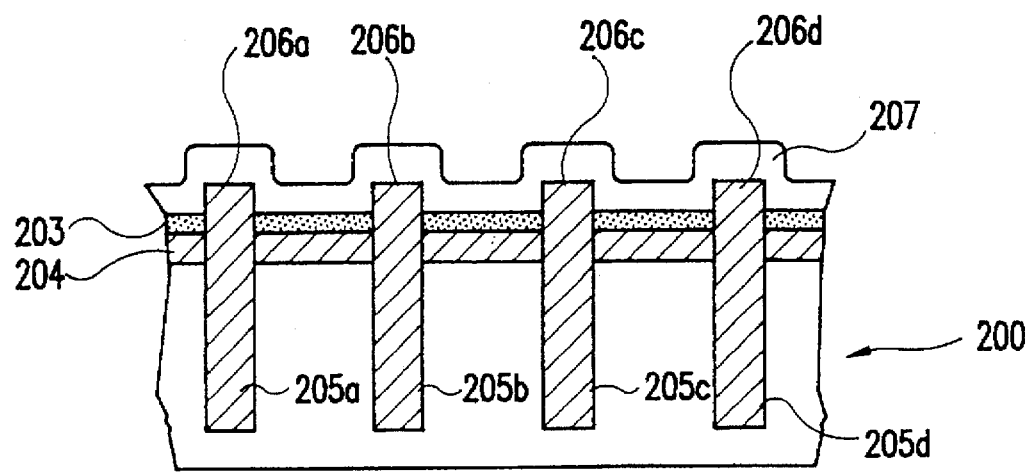
Figure 17:
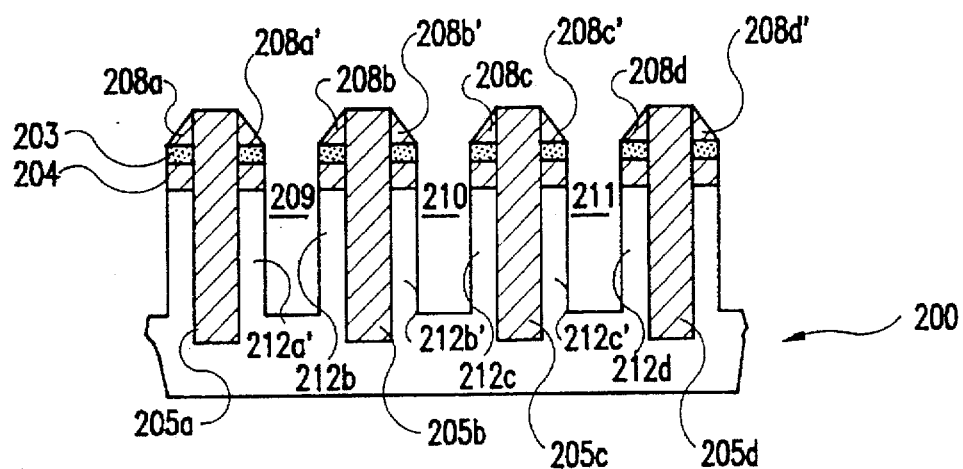
Figure 18:
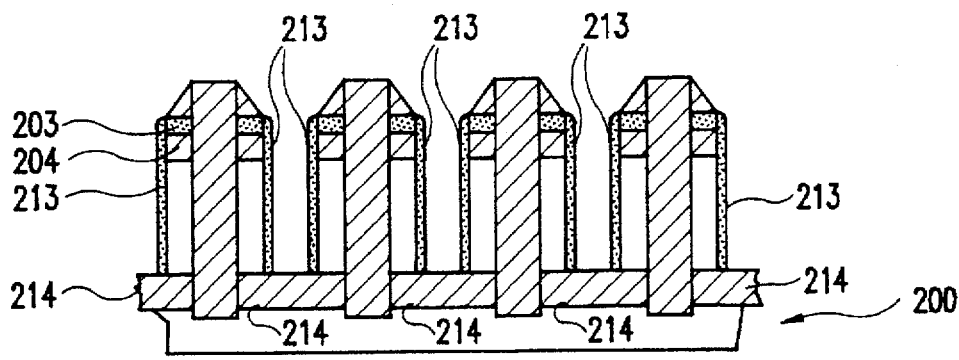
Figure 19:
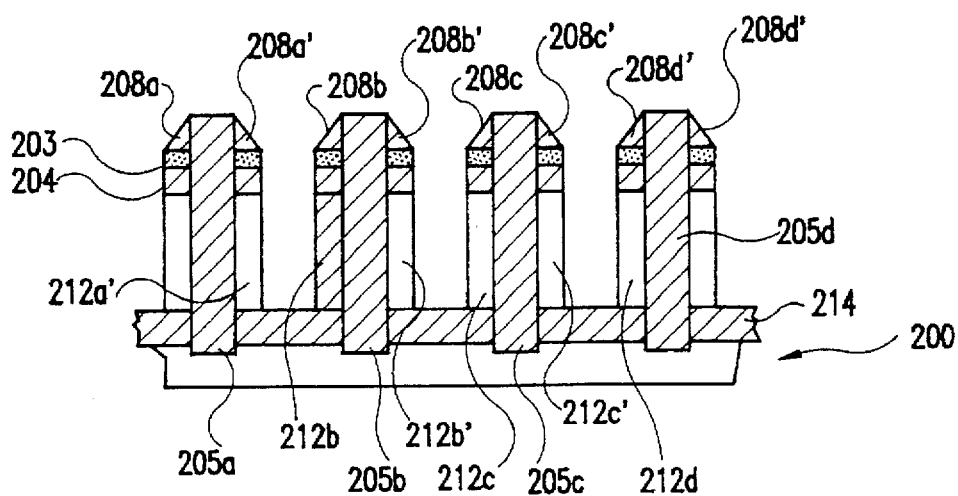

In FIG. 14, a silicon substrate 200 which is formed with alternating layers, from top to bottom of herein silicon nitride 201, polysilicon 202, silicon nitride 203 and silicon oxide 204, and are used in forming the insulating trenches 205a, 205b, 205c, and 205d, herein filled with silicon oxide. The upper surface of the formed silicon oxide trenches are planarized, preferably by chem/mech polishing, with the silicon nitride layer 201 being the stopping surface. The combined thickness of top two layers, silicon nitride layer 201 and polysilicon layer 202, control the width of the to-be-formed silicon sidewalls and are selected accordingly, along with the depth of planarization, to achieve the desired width. The particular materials selected for these two layers depend on etching selectivity between them and the material used for trenches. These layers 201 and 202 are removed as shown in FIG. 15 to leave the upper ends of the trenches 208a, 206b, 206c, and 206d which are projecting above the other two layers 203 and 204, and which will serve as mandrels for forming the silicon sidewalls to be formed. Next, a conformal coating of polysilicon 207 is deposited as shown in FIG. 16 and etched away to the top of the upper ends of the trenches or mandrels 206a, 206b, 206c, and 206d to leave sidewall barriers 208a, 208a', 208b, 208b', 208c, 208c' 208d, and 208d' as shown in FIG. 17. The nitride and oxide layers not under the sidewall barriers are removed by etching. To form the silicon sidewalls and open trenches in silicon body between the silicon sidewalls, the polysilicon barriers is first oxidized as shown in FIG. 17 to provide a material with etch selectivity different from the silicon. After etching the silicon body, the resulting structure is shown in FIG. 17 with open trenches 209, 210, and 211, each respectively separating silicon sidewalls 212a' and 212b, 212b' and 212c, and 212c' and 212d which are backed by insulating trenches 205a, 205b, 205c, and 205d, respectively, herein silicon oxide. Preferably, the etching is anisotropic, such as reactive ion etching, with the appropriate gases for the material being etched as is well known in the art. Each of open trenches with the silicon sidewalls backed by insulating trenches is a partial vertical SOI cell and, if the starting substrate were a SOI substrate, the bottom of the cell also will be insulated which, is not shown in this embodiment. Rather, preferably, the bottom insulating layer is formed in the next step, as shown in FIG. 18. A silicon nitride barrier layer 213 is formed on each of the silicon sidewalls, herein including the nitride and oxide layers 203 and 204. For converting the silicon to silicon oxide, a layer of silicon oxide 214, in the present instant, is thermally grown using the silicon in each of the open trenches, such as 209, 210, and 211, to a thickness sufficient to permit lateral growth to abut the silicon oxide trenches 205a, 205b, 205c, and 205d backing the silicon sidewalls. After removal of the silicon nitride barrier 213, as shown in FIG. 19, each of the cells (pair of silicon sidewalls) is surrounded by insulating material, both vertically and at the bottom of the cell in this embodiment which started with a conventional silicon wafer. Semiconductor devices now can be fabricated in the silicon sidewalls.

Figure 20:
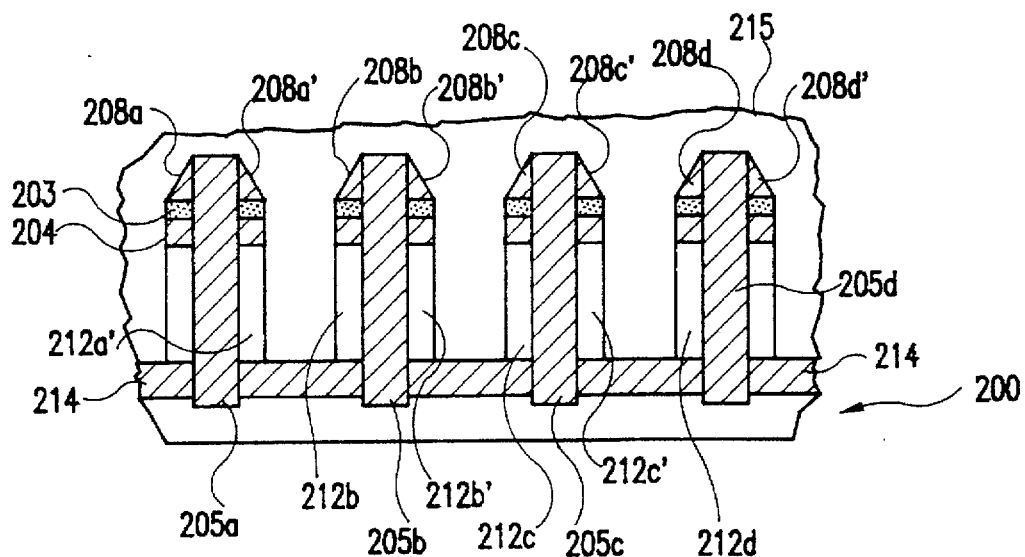
Figure 21:
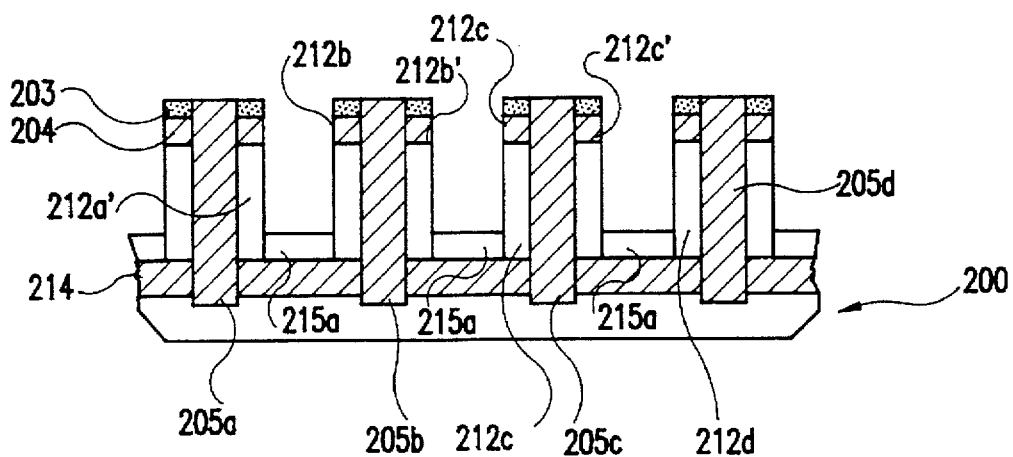
FIGS. 21, 22, 23, 24, 25, 26, 27 and 28 are cross sectional views of the continuation of the alternative process showing the beginning steps of fabricating either CMOS or complementary bipolar devices in the SOI cells of the present invention.
Figure 22:
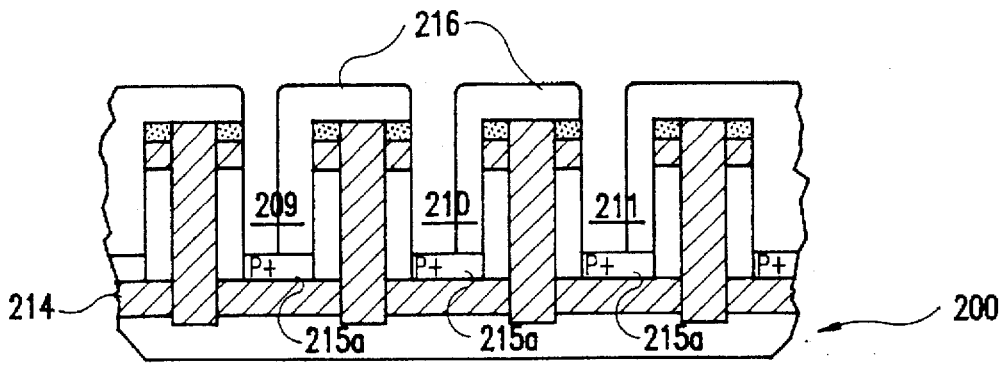

In the following FIGS. there will described the fabrication of CMOS and complementary bipolars devices in the silicon sidewalls 212a', 212b, 212b', and 212c. As showed in FIG. 20, the open cells are filled with polysilicon 215 which is planarized herein by chem/mech polishing to the surface of the silicon nitride 203 and partially removed by anisotropic etching, herein reactive ion etching, to leave a polysilcon layer 215a at the bottom of cells bridging between the silicon sidewalls as shown in FIG. 21. The chem/mech polishing removed the oxide converted polysilicon barriers 208a through 208d (FIG. 20 and the upper end of the oxide trenches 206a through 206d (FIG. 20). Next, as shown in FIG. 22, a photoresist layer 216 is applied and patterned so that only one half of the open trenches 209, 210, and 211, including half of the polysilicon layer 215a is exposed. The exposed polysilicon is converted to $P^+$ by an impurity, herein boron ions, preferably by ion implantating at 90 degrees. The other portion of polysilicon 215a is converted to $N^+$ by similar steps of applying and patterning another photoresist layer 217 to expose the other portion of the polysilicon layer 215a to an $N^+$ impurity, herein arsenic ions, preferably by ion implantating at 90 degrees. These implantations of $P^+$ and $N^+$ impurities will subsequently be diffused, by thermal cycling, into the silicon sidewalls to form the drains of the CMOS devices.

Figure 24:
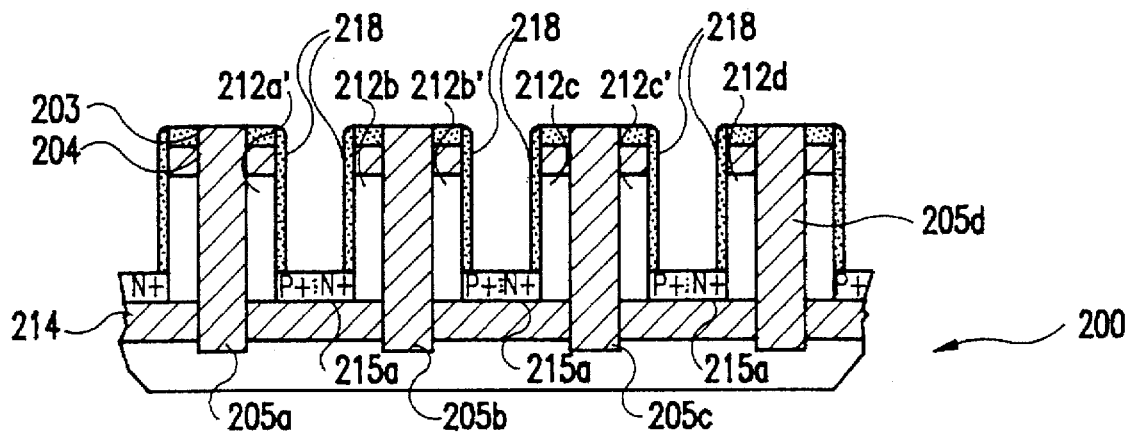
Figure 25:
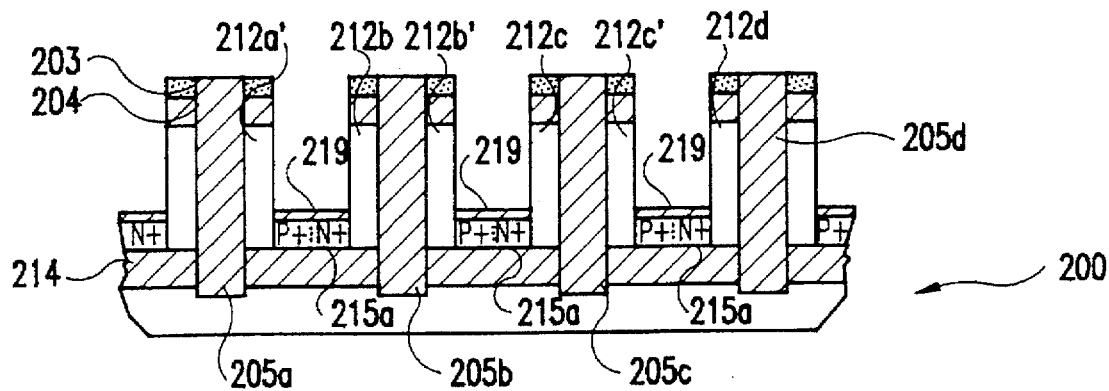
Figure 26:
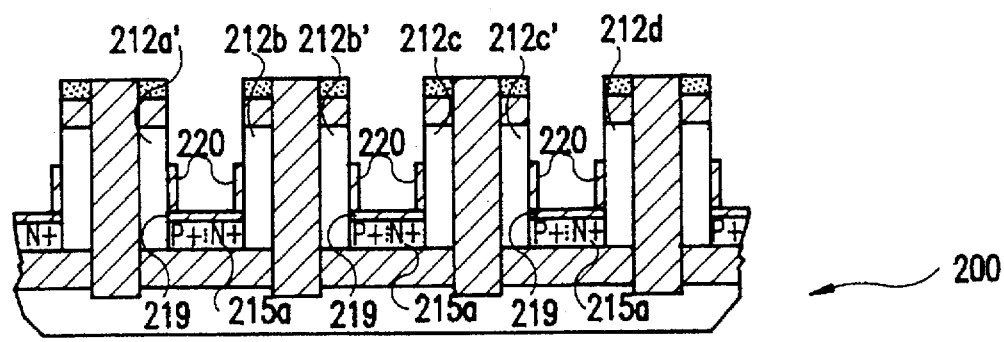
Figure 27:
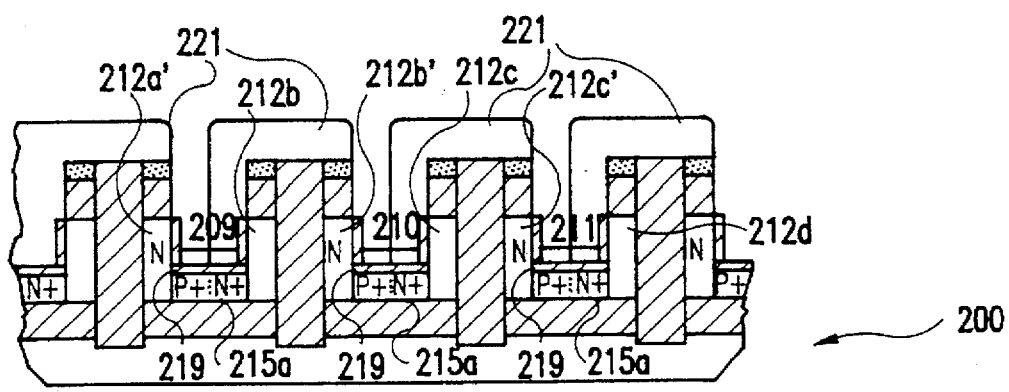
Figure 28:
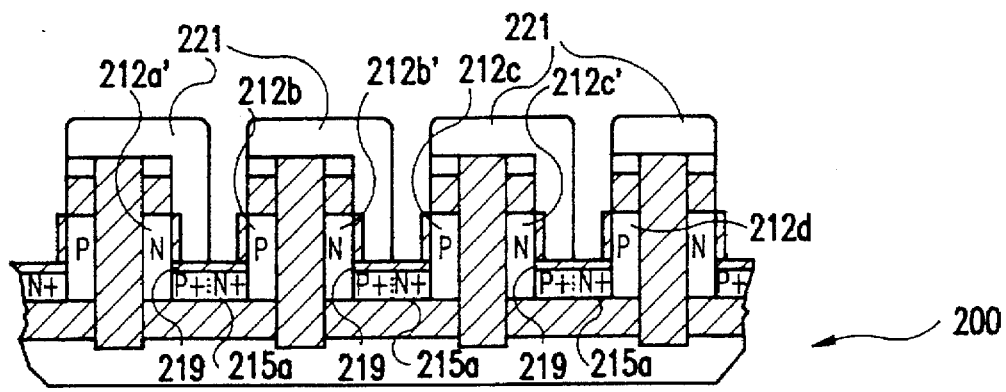
Figure 29A:
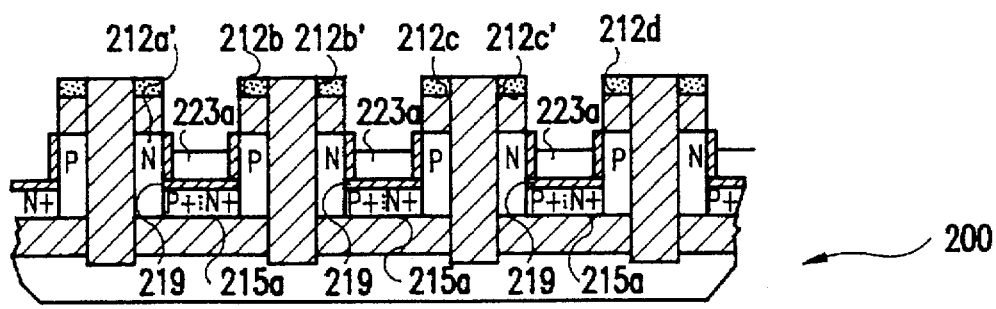
FIGS. 29a, 30a, 31a, 32a, 33a and 34a are cross sectional views of the continuation of the alternative process showing the remaining steps of fabricating the CMOS devices in the SOI cells of the present invention.
Figure 29B:
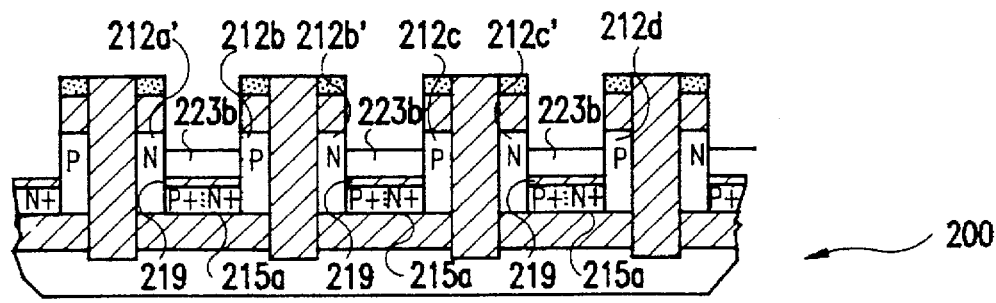
FIGS. 29b, 30b, 31b, 32b, 33b and 34b are cross sectional views of the continuation of the alternative process showing the remaining steps of fabricating the complementary bipolar devices in the SOI cells of the present invention.
Figure 30A:
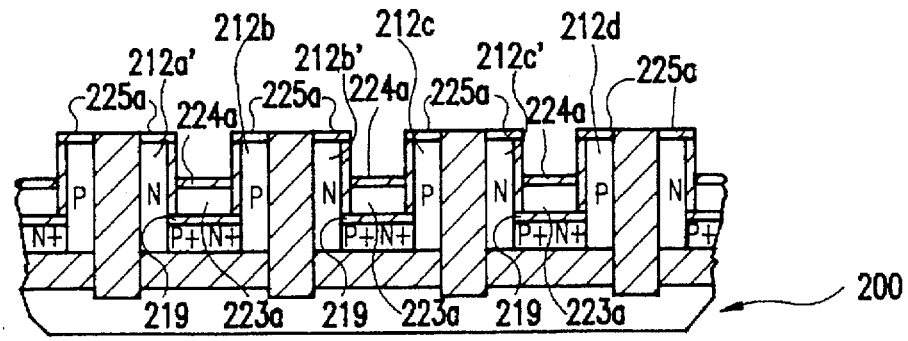

Before forming the channels of the vertical CMOS devices, the doped polysilicon layer 215a must be isolated. As is shown in FIG. 24, silicon nitride barrier layers 218 are formed on the silicon sidewalls, such as 212a', 212b, 212b', 212c, 212c', and 212d and the nitride and oxide layers 203 and 204. Next, silicon oxide layers 219 are grown in the polysilicon layer 215a as shown in FIG. 25. Alternatively, either BoroSilicate Glass (BSG) or BoroPhosphoSilicate Glass (BPSG) can be deposited in place of the grown oxide to perform the isolation function of the silicon oxide layers 219 and this alternative step eliminates the need for the silicon nitride barrier layers 218 (FIG. 24). Next, a channel oxide layer 220 is grown as shown in FIG. 26 and, if oxide isolation is used in the previous step, the silicon nitride barrier layers 218 must be removed first. Using a patterned photoresist layer 221, the N doped channel is formed in one silicon sidewall as shown in FIG. 27 and the P doped channel is formed in the other silicon sidewall by another patterned photoresist layer 222 as shown in FIG. 28, both preferably by ion implantation at an angle determined by the size of one half of the open trenches, such as 209, 210, and 211. Herein, it is about 60 degrees. To connect a polysilicon gate to the N and P channels, a polysilicon layer 223a is deposited on the oxide layer 219 and it bridges between the oxide channel layers 220 as shown in FIG. 29a. The height of the polysilicon layer 223a determines the initial channel length. Alternatively, by eliminating the step of forming the channel oxide layer 220, all of the previous step can be used in fabricating the collectors and bases of complementary bipolar devices as shown in FIG. 29b be merely changing the doping levels of the P and N impurities. These bipolar devices are at the point of a polysilicon layer 223b having been formed and it bridges between the bases in the silicon sidewalls, such as 212a' and 212b, 212b' and 212c, and 212c' and 212d.

The following FIGS. 30a through 34a will be used to describe the completion of CMOS devices from FIG. 29a using the method of the present invention. Then, FIGS. 30b through 34b will be used to describe the completion of complementary bipolar devices from FIG. 29b using the method of the present invention.

Figure 31A:
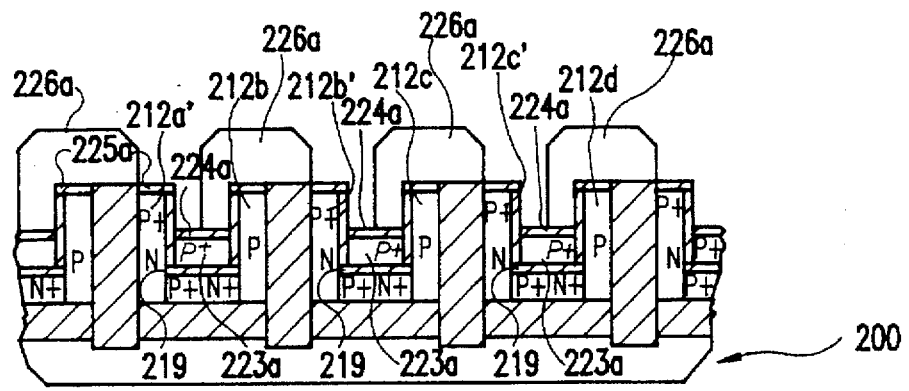
Figure 32A:
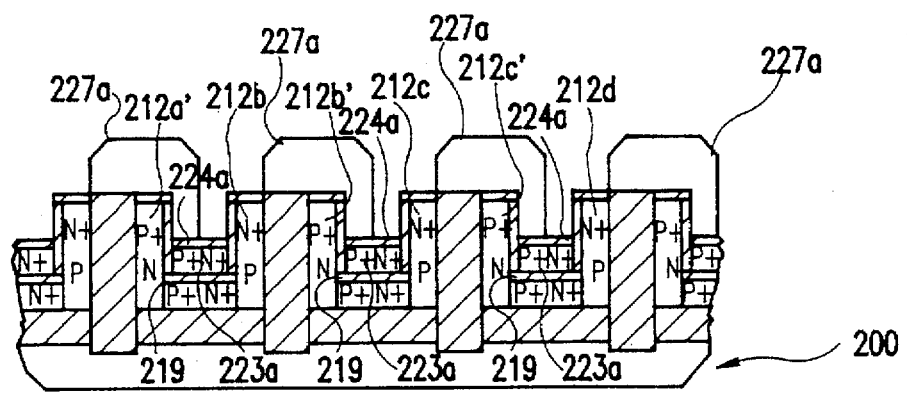
Figure 33A:
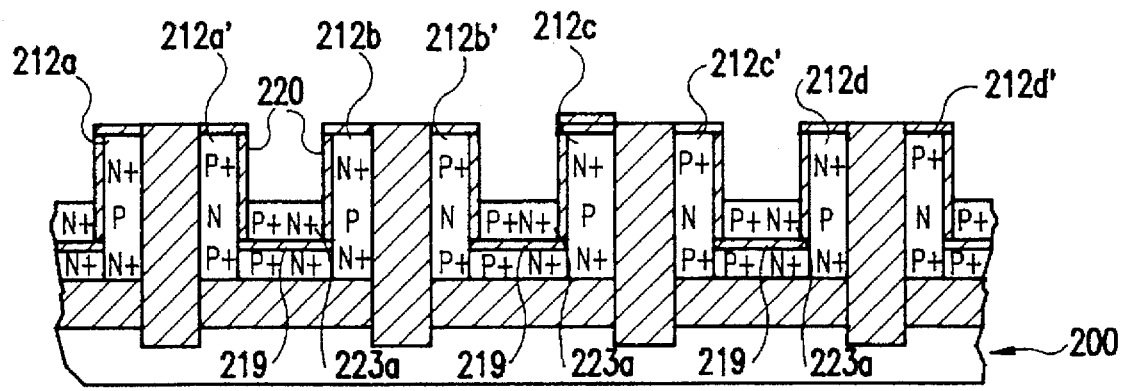
Figure 34A:
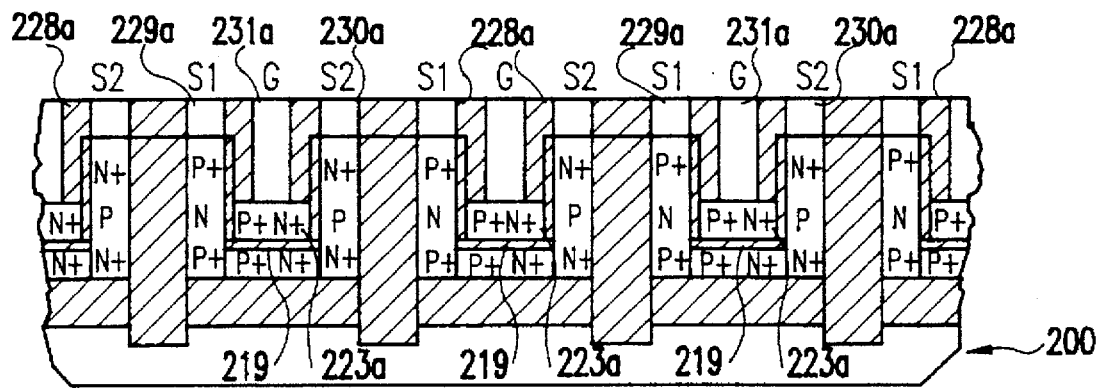
Figure 30B:
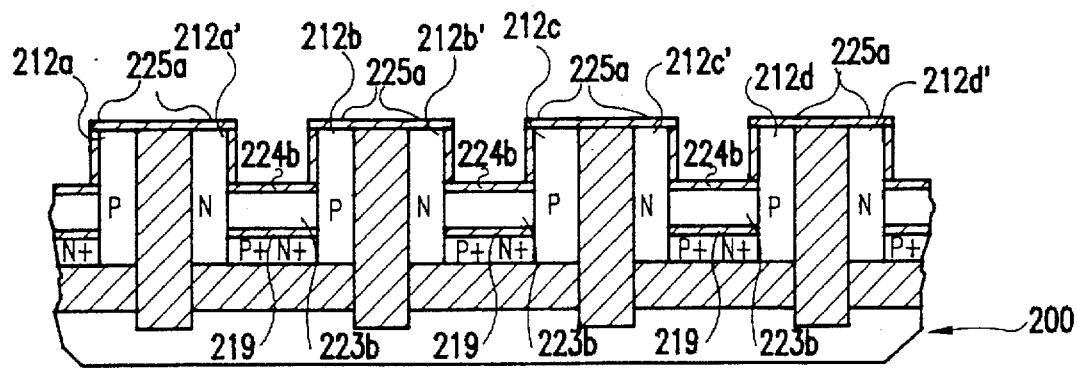

To continue with the fabrication of the CMOS devices in FIGS. 30a through 34a, an oxide layer 224a is thermally grown in the polysilicon layer 223a and the upper portion 225a of the exposed silicon sidewalls, after removing the oxide and nitride layers 203 and 204 at the top of the silicon sidewalls. Next, a photoresist layer 226a is applied and patterned permit doping the exposed portion of the polysilicon layer 223a and the exposed upper portion 225a of the silicon sidewalls with a $P^+$ impurity as shown in FIG. 31 and a $N^+$ impurity as shown in FIG. 32 using another photoresist layer 227a. Since the impurities for the gate and source regions are, herein implanted and the drain regions must be diffused from the drain polysilicon 215a, the silicon wafer is thermally cycled to drive them in, as shown in FIG. 33 and create the profiles of the impurities. The drive-in depth of the source impurity determines the final channel length. To complete the vertical CMOS devices, the surface of the wafer is passivated with a conventional passivation material, such as BSG 228a, and patterned to form openings for contacts 229a, 230a, and 231a to the two sources, S1 and S2, and the common gate, G, respectively, as shown in FIG. 34a.

Figure 31B:
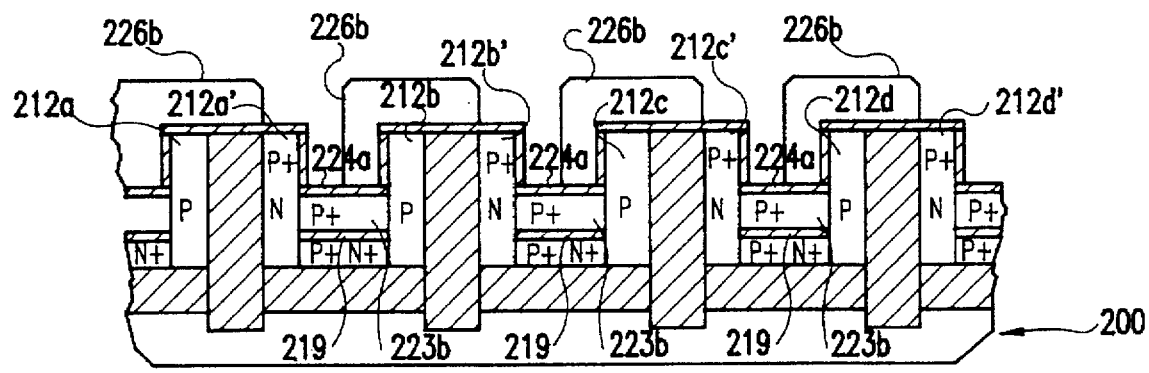
Figure 32B:
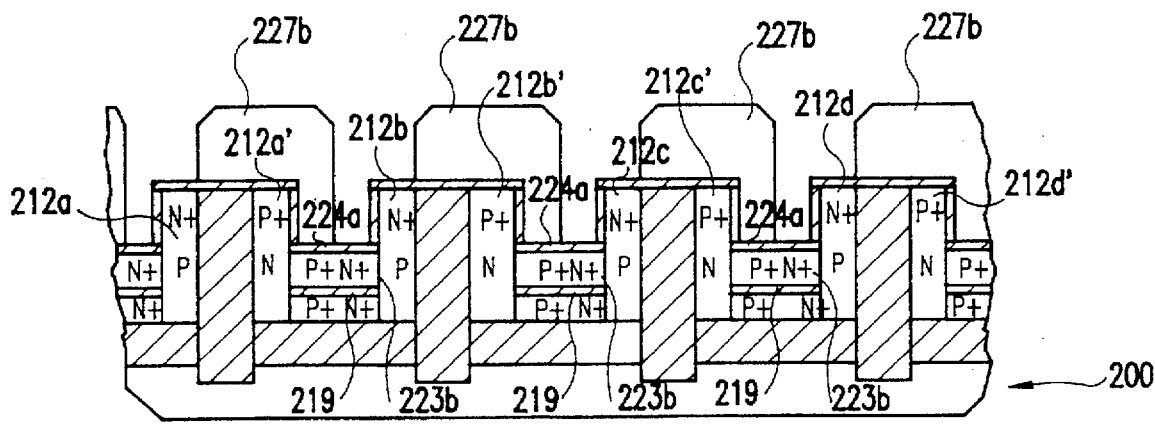
Figure 33B:
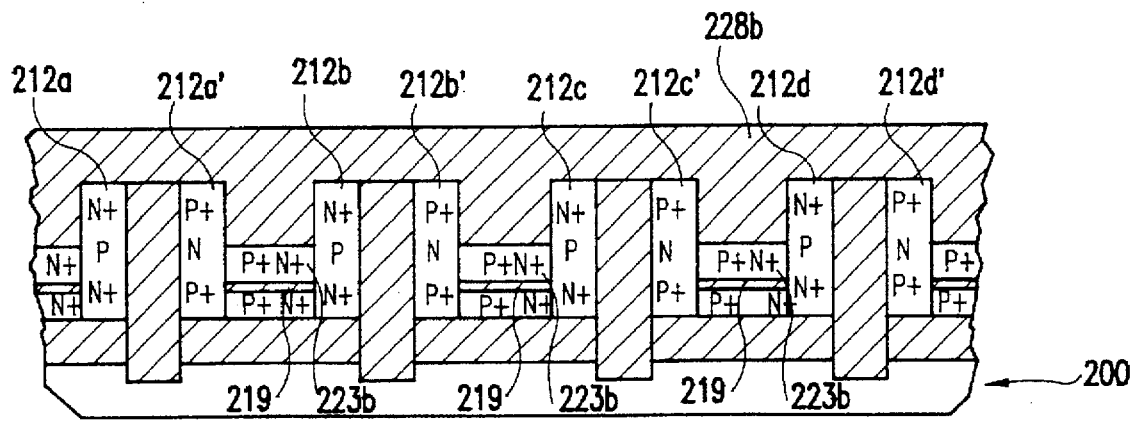
Figure 34B:
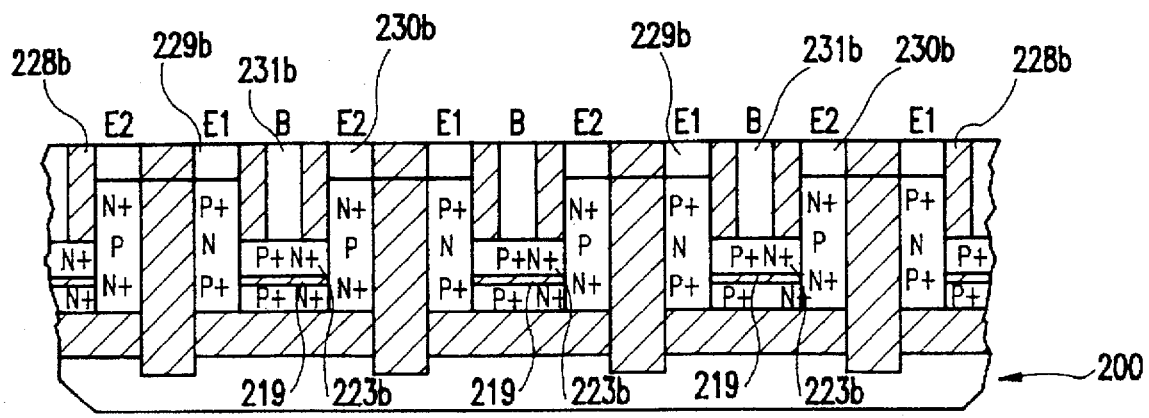

Turning now to the continuation from FIG. 29b of the fabrication of the complementary bipolar devices in the method of the present invention. An oxide layer 224b is thermally grown in the polysilicon layer 223b and the upper portion 225b of the exposed silicon sidewalls 212a through 212d. Next, a photoresist layer 226b is applied and patterned to permit doping of the upper portion 225a of the silicon sidewalls for the emitter regions, preferably by ion implantation at 90 degrees, with a $P^+$ impurity as shown in FIG. 31b and a $N^+$ impurity as shown in FIG. 32b using another photoresist layer 227b. Since the impurities for the emitter and base regions are, herein directly implanted and the collector regions must be diffused from the collector polysilicon 215b, the silicon wafer is thermally cycled to drive them in as shown in FIG. 33b. To complete the vertical complementary bipolar devices, the surface of the wafer is passivated with conventional passivation material, such as BSG 228b, and patterned to from openings for contacts 229b, 230b, and 231b to the two emitters, E1 and E2, and the common base, B, respectively, as shown in FIG. 34b.

As an illustration of both FET and bipolar devices being formed in silicon sidewalls sections of the same cell, FIGS. 35 through 38 show in perspective the fabrication of a CMOS device in two of the sections and a bipolar device in a third section. Since the steps of forming both CMOS and complementary bipolar devices have been previously shown in FIGS. 14 through 34 and described relative to those FIGS., only four steps in the process of the present invention are used for this illustration.

Figure 35:
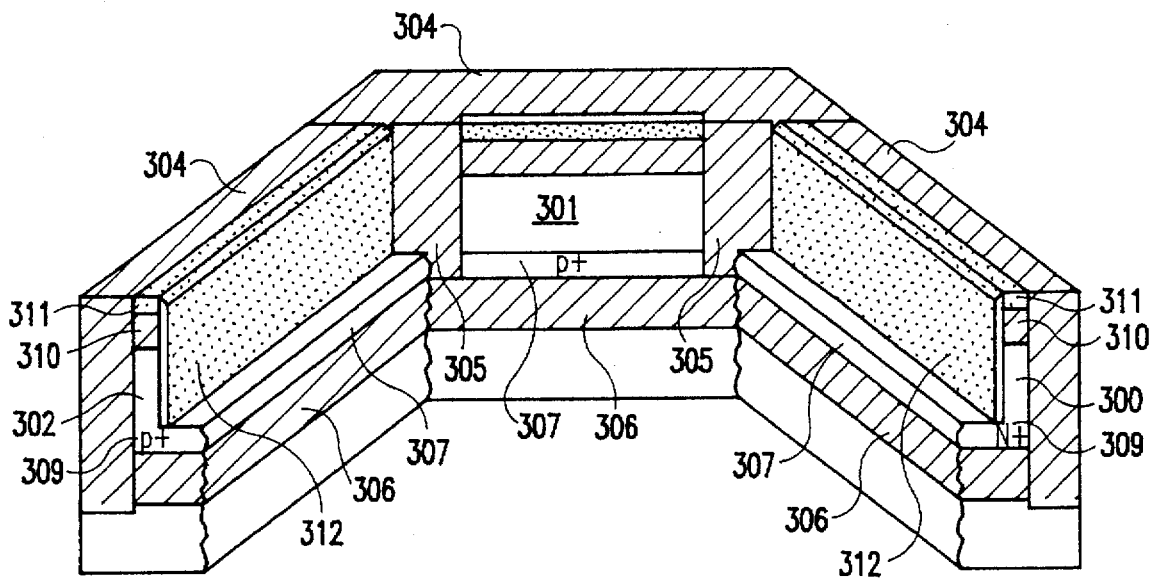
FIGS. 35, 36, 37 and 38 are cross sectional, perspective views of a partial cell broken away during four of the steps of the alternative process showing the fabrication of both a CMOS device and a bipolar device in an SOI cell of the present invention.

FIG. 35 shows a broken away perspective cross-sectional view of three silicon sidewall sections 300, 301, and 302, each of the three sections being backed by an isolating trench 304, herein of silicon oxide. Two isolating trenches 305 separate the three silicon sidewall sections and herein are silicon oxide. Preferably, the starting substrate is a conventional silicon substrate and an isolating layer 306, herein thermally grown silicon oxide, is formed at the bottom of the silicon sidewalls in a previous step not shown but corresponds to FIG. 18 and the description thereof. A polysilicon layer 307 is deposited on the isolating layer 306 and doped with $P^+$ and $N^+$ impurities as shown in FIGS. 35 through 38. These impurities will create the drains 308 in the CMOS device and the collector 309 in the bipolar device.

Figure 23:
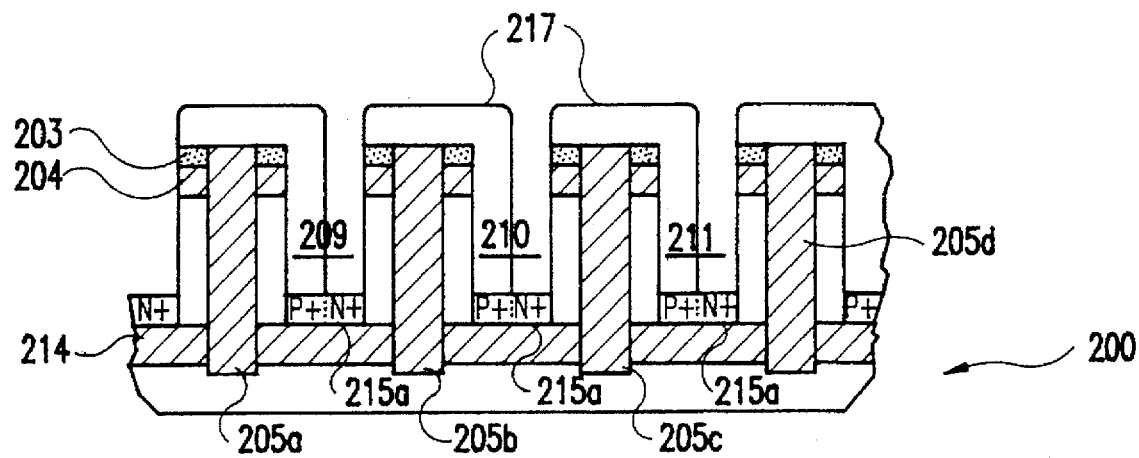

Preferably, the doping is achieved by ion implantation, and the steps for forming the doped polysilicon layers correspond to the steps of FIGS. 21 through 23 and the description thereof. Atop the silicon sidewall sections are layers of silicon oxide 310 and silicon nitride 311 in that order which were needed in the previous processing steps and also be needed in the subsequent processing steps. Formed adjacent of the faces of the silicon sidewall sections 300 and 302 of the CMOS devices is a vertical silicon nitride layer 312. This layer also is formed adjacent the bilpolar section 301 but, due the cross section, it does not show. The silicon nitride layer 312 is to provide a protective barrier for the faces of the silicon sidewalls when an oxide layer 313 (FIGS. 36 through 38) is thermally grown in the polysilicon layer 307. At this stage of the process, FIG. 35 corresponds to FIG. 24. As described previously, the silicon nitride layer 312 is removed from faces of silicon sidewalls 300 and 302, but not 301 to permit the formation of a gate oxide layer 314 (FIG. 36) on the CMOS device but not the bipolar device. After the formation of the gate oxide layer, the silicon nitride layer (not shown) on the bipolar device is removed and, preferably, an silicon oxide protective layer is formed prior to the ion implantation of the base impurity. Following ion implantation and prior to the deposition of a polysilicon layer which will be adjacent the base region of the bipolar, the silicon oxide protective layer is removed. Further explanation on this aspect of the fabrication of the bipolar can be found in the description associated with FIG. 29b.

Figure 36:
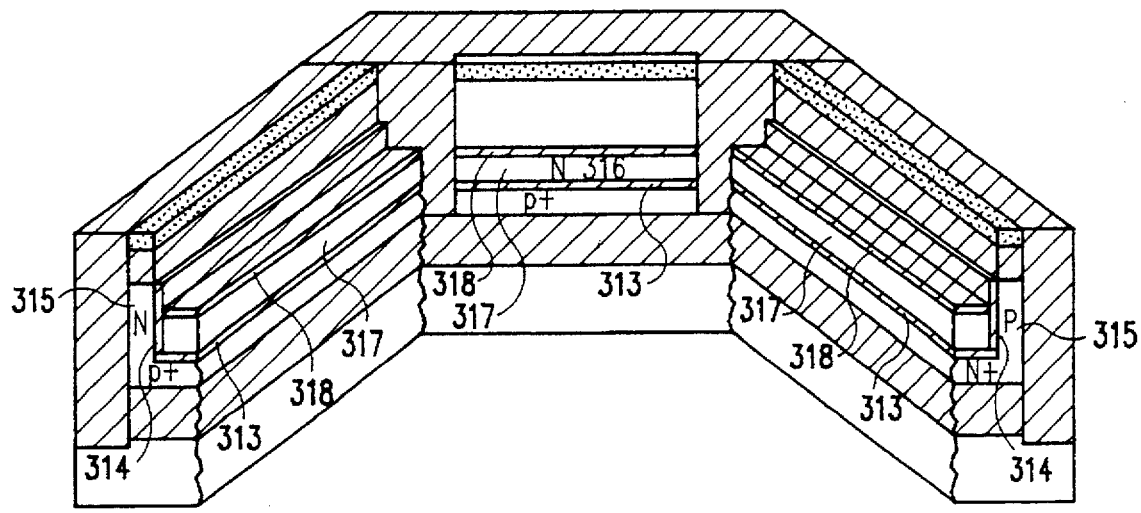

In FIG. 36, the three silicon sidewalls have progressed to where the gate oxide layer 314 is formed and the center region of the silicon sidewalls are doped with the appropriate impurity for the gates 315 of the CMOS device and for the base 316 of the bipolar device. A second polysilicon layer 317 is deposited on the oxide isolating layer 313 and is formed with an isolating layer 318 on its upper surface. This structure correspond to FIGS. 30a and 30b and reached this stage by steps shown in FIGS. 25 through 28 and FIGS. 29a and 29b and the description thereof.

Figure 37:
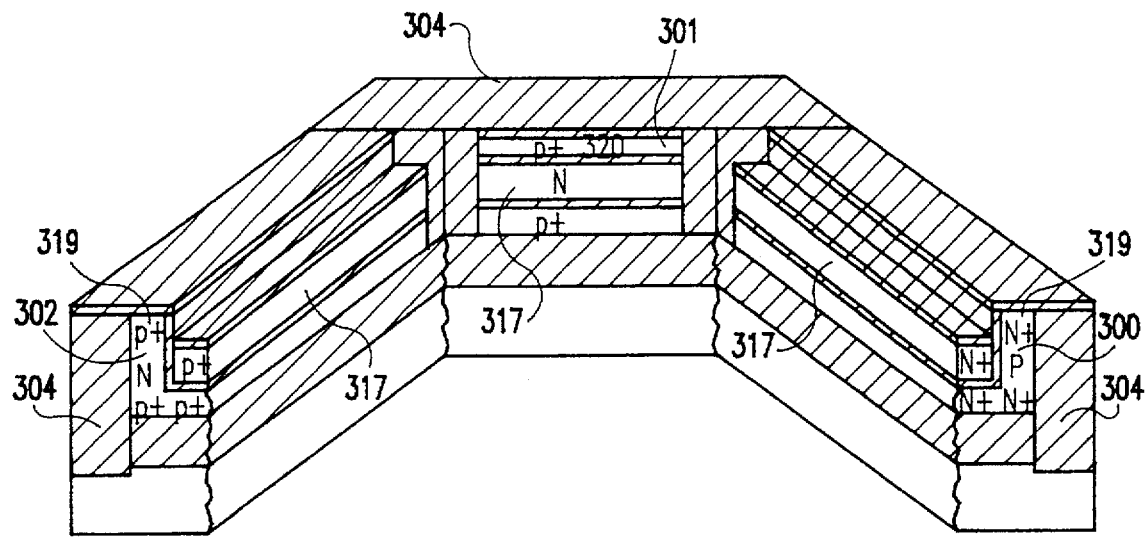

By FIG. 37, the fabrication of the CMOS device and bipolar device are at the stage where the silicon oxide and silicon nitride layers 308 and 309 are removed along with upper portion of the silicon oxide trenches 304 by preferably chem/mech polishing. The upper regions of the silicon sidewalls 300 and 302 are doped with the appropriate impurities as shown to form the sources 319 of the CMOS device and silicon sidewall 301 is doped to form the emitter 320 of the bipolar device, herein by ion implantation at 90 degrees. The polysilicon layer 317 is implanted at the same time with the appropriate impurity as shown. The silicon wafer containing the devices is thermally cycled to drive in the impurities, especially those for the drains of the CMOS device and the collector for the bipolar since they were initially implanted into the polysilicon layer 307 in the same plane. FIG. 37 corresponds to FIGS. 33a and 33b and involved the steps shown in FIGS. 30a through 32a and FIGS. 30b through 32b and the description thereof.

Figure 38:
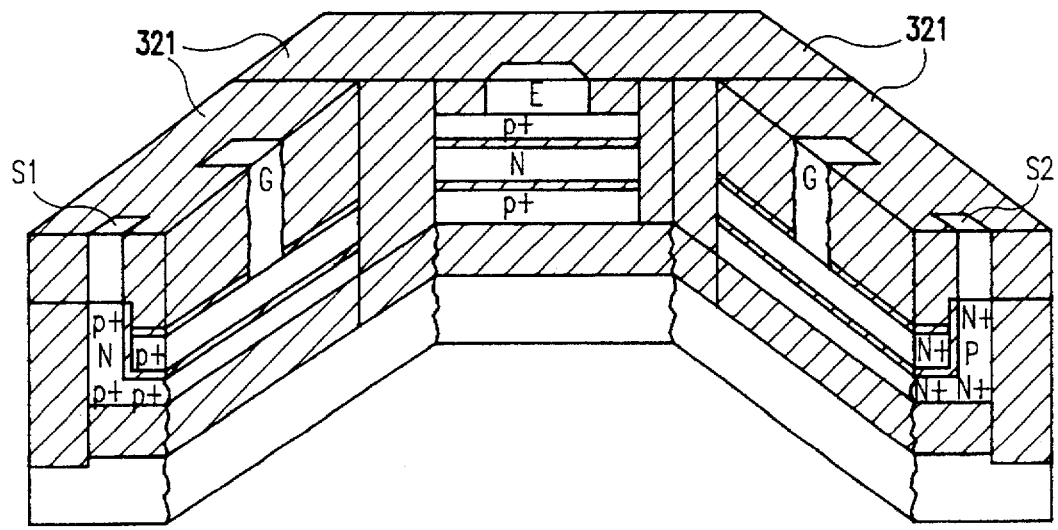

FIG. 38 shows CMOS device and the bipolar device with a passivating layer 321 and contacts made to the sources, S1 and S2, and the gate, G, of the CMOS device and the emitter, E, of the bipolar device. The contacts of the drains of the CMOS device and the collector and base of the bipolar device are not shown. It will be recognized by one skilled in the art that the contacts do not have to made from the surface as shown but can be made between devices within the cell as illustrated in FIGS. 2a and 2b through FIGS. 7a and 7b.

The present invention as herein described is not to be construed as limiting its scope. Many embodiments of the present invention will become clear to those skilled in the art in light of the teachings of the specification. Thus, the claimed invention can be widely modified and varied and still be within the claimed invention.

What is claimed is:

1. In a method for fabricating integrated circuit in a silicon wafer having vertical semiconductor devices said method comprising:

forming at least one mandrel on the surface of a silicon body;

applying a conformal barrier coating over said mandrel;

anisotropic etching said conformal coating to the surface of the mandrel leaving the conformal coating at sidewalls of the mandrel;

anisotropic etching said silicon body, using each of the conformal coating sidewalls as an etch barrier, to form vertical silicon sidewalls each having at least one vertical exposed face and a top and bottom surface;

forming impurity regions in said vertical silicon sidewalls to create semiconductor devices;

forming interconnections between said impurity regions of said semiconductor devices; and isolating said semiconductor devices from each other, insulating the bottom surface of said silicon sidewalls from the silicon body.

2. The method of claim 1 wherein said insulating of the bottom surface of said silicon sidewalls is by thermally oxidizing the bottom of said silicon sidewalls.

3. The method of claim 1 wherein said insulating of the bottom surface of said silicon sidewalls is by starting the fabrication with a semiconductor wafer in which an insulating layer is formed in the wafer and is a silicon on insulator wafer.

4. The method of claim 1 wherein said interconnections between impurity regions of the devices are substantially in the planes of the impurity regions.

5. The method of claim 1 wherein said interconnections between impurity regions of the devices are essentially in the planes of the impurity regions.

6. The method of claim 1 wherein a plurality of mandrels are used to form a plurality of vertical silicon sidewalls in said silicon body, said plurality of silicon sidewalls being divided into cells, each cell having a number of vertically separated silicon sidewalls containing impurity regions and having both front and back exposed faces, and wherein at least some of the interconnections between the impurity regions of different cells are made from the back exposed faces of the silicon sidewalls.

7. The method of claim 6 wherein a pair of silicon sidewalls of at least one of the cells are fabricated with the appropriate impurities so as to form a bipolar device in one of the silicon sidewalls and a field effect transistor in another of the silicon sidewalls of said pair.

8. The method of claim 1 wherein the mandrel is an insulating trench in the silicon body.

9. The method of claim 1 wherein the integrated circuit being formed contains at least one field effect transistor and the gate impurity is implanted at an angle of less than 90 degrees.

10. The method of claim 1 wherein a plurality of vertical silicon sidewalls are formed and the vertical insulation between said sidewalls is deposited during the fabrication of the impurity regions in the sidewalls.

* * * * *